(12) United States Patent
Huang (10) Patent No.: US 8,725,763 B2
(45) Date of Patent: May 13, 2014

(54) MASSIVE MODEL VISUALIZATION WITH SPATIAL INDEXING

(75) Inventor: Jianbing Huang, Shoreview, MN (US)

(73) Assignee: Siemens Product Lifecycle Management Software Inc., Plano, TX (US)

(*) Notice: Subject to any disclaimer, the term of this patent is extended or adjusted under 35 U.S.C. 154(b) by 103 days.

(21) Appl. No.: 13/606,555

(22) Filed: Sep. 7, 2012

(65) Prior Publication Data

US 2013/0132424 A1 May 23, 2013

(30) Foreign Application Priority Data

Nov. 23, 2011 (IN) .......................... 1486/KOL/2011

(51) Int. Cl.
*G06F 17/30* (2006.01)
(52) U.S. Cl.
USPC ........................................... 707/769
(58) Field of Classification Search
None
See application file for complete search history.

(56) References Cited

U.S. PATENT DOCUMENTS

| | | | |
|---|---|---|---|
| 6,057,847 A | 5/2000 | Jenkins | |
| 611,845 A | 9/2000 | Cooper et al. | |
| 6,118,456 A | 9/2000 | Cooper | |
| 6,377,263 B1* | 4/2002 | Falacara et al. | 345/473 |
| 6,898,560 B1* | 5/2005 | Das | 703/7 |
| 693,394 A1 | 8/2005 | Silva et al. | |
| 6,933,946 B1 | 8/2005 | Silva et al. | |
| 7,127,308 B2* | 10/2006 | Bigelow | 700/97 |
| 7,617,444 B2* | 11/2009 | Rothschillwe et al. | 715/213 |
| 2002/0004710 A1* | 1/2002 | Murao | 702/167 |
| 2002/0035463 A1* | 3/2002 | Lynch et al. | 703/21 |
| 2002/0162081 A1 | 10/2002 | Solomon | |
| 2002/0184246 A1* | 12/2002 | Shkolnik | 707/203 |
| 2004/0117393 A1* | 6/2004 | DeMesa et al. | 707/100 |
| 2004/0210546 A1* | 10/2004 | Spooner et al. | 706/45 |
| 2005/0071135 A1* | 3/2005 | Vredenburgh et al. | 703/1 |
| 2005/0223320 A1* | 10/2005 | Brintzenhofe et al. | 715/517 |

(Continued)

FOREIGN PATENT DOCUMENTS

EP 1 804 187 A2 7/2007
EP 2 261 827 A1 12/2010

OTHER PUBLICATIONS

Hierarchy ID, Kent Tegels, Microsoft Corporation, MSDN Magazine, Sep. 2008, retrieved on Feb. 12, 2014, retrieved from the Internet <URL: http://msdn.microsoft.com/en-us/magazine/cc794278.aspx>.*

(Continued)

*Primary Examiner* — Neveen Abel Jalil
*Assistant Examiner* — Tyler Torgrimson (57) ABSTRACT

Systems and methods for massive model visualization in product data management (PDM) systems. A method includes storing a hierarchical product data structure that includes a plurality of occurrence nodes and component nodes. The method includes creating an occurrence equivalency table from, the hierarchical product data structure, that identifies at least one anchor occurrence node and at least one equivalent occurrence node. The product component corresponding to the equivalent occurrence node is spatially located within a specified distance threshold of product component corresponding to the anchor occurrence node. The method includes creating an anchor occurrence table corresponding to the hierarchical product data structure that lists a plurality of unique occurrence chain represented by the hierarchical product data structure, where each equivalent occurrence node is replaced by its corresponding anchor occurrence node, and that associates each listed unique occurrence chain with an associated cell index value.

21 Claims, 5 Drawing Sheets

(56) References Cited

U.S. PATENT DOCUMENTS

| | | | |
|---|---|---|---|
| 2006/0074609 A1* | 4/2006 | Freeman et al. | 703/1 |
| 2006/0098009 A1 | 5/2006 | Zuniga | |
| 2007/0013709 A1* | 1/2007 | Charles et al. | 345/581 |
| 2007/0159480 A1* | 7/2007 | Delarue et al. | 345/427 |
| 2008/0077365 A1* | 3/2008 | Fukumura | 703/1 |
| 2008/0184185 A1* | 7/2008 | Saelzer et al. | 716/11 |
| 2009/0016598 A1* | 1/2009 | Lojewski | 382/154 |
| 2009/0106530 A1 | 4/2009 | Lauterbach et al. | |
| 2010/0114355 A1* | 5/2010 | Harashima et al. | 700/107 |
| 2010/0198383 A1* | 8/2010 | Richey | 700/98 |
| 2011/0167398 A1* | 7/2011 | Furumoto | 716/112 |
| 2013/0080477 A1* | 3/2013 | Evans et al. | 707/802 |
| 2013/0080478 A1* | 3/2013 | Ben-Haim et al. | 707/802 |
| 2013/0132373 A1* | 5/2013 | Huang et al. | 707/722 |
| 2013/0132432 A1* | 5/2013 | Carter et al. | 707/770 |

OTHER PUBLICATIONS

Toward SCM/PDM integration?, Estublier et al., University of Grenoble, ECOOP '98 Proceedings of the SCM-8 Symposium on System Configuration Management, 1998, pp. 75-94, retrieved on Feb. 12, 2014, retrieved from the Internet <URL:http://pdf.aminer. org/000/578/207/toward_scm_pdm_integration.pdf>.*

Modeling Hierarchies, Tom Haughey, Association with the Meta-Data and Data Modeling Summit, Jun. 14-16, 2005, retrieved on Feb. 12, 2014, retrieved from the Internet <URL:http://www.tdan.com/view-special-features/5400/>.*

Feasibility Study of 4D CAD in Commercial Construction, Koo et al., CIFE Technical Report #118, Aug. 1998, retrieved on Feb. 12, 2014, retrieved from the Internet <URL:http://cife.stanford.edu/sites/default/files/TR118.pdf>.*

"Massive Model 3d Navigation with Right Hemisphere's Deep Vision file format"; Aug. 9, 2011, Printed from internet; http://rhdeepexploration.wordpress.com/2011/08/09/massive-model-3d-navigation-with-right-hemispheres-deep-vision-file-format/; 6 pages.

Non-Final Office Action issued Oct. 22, 2013 in U.S. Appl. No. 13/606,574, 14 Pages.

Regli, et al., "Managing digital libraries for computer-aided design", 2000, Computer-Aided Design, Elsevier, vol. 32, pp. 119-132.

PCT International Search Report dated Feb. 25, 2013 corresponding to PCT Application No. PCT/US2012/066186 filed Nov. 21, 2012 (16 pages).

John C. Hart, "Chapter 11—Procedural Synthesis of Geometry", In: F. Kenton Musgrave, "Texturing & Modeling", ISBN: 1-55860-848-6, 2003, San Francisco, CA, 684 pages.

Rubin et al., "A 3-Dimensional Represenation for Fast Rendering of Complex Scenes", ComputerGraphics Proceedings, Proceedings of Siggraph Annual International Conference on Computer Graphics, vol. 14, No. 3, Jan. 1, 1980, pp. 110-116.

PCT International Search Report dated Feb. 15, 2013 corresponding to PCT Application No. PCT/US2012/065837 filed Nov. 19, 2012 (12 pages).

PCT International Search Report dated Feb. 12, 2013 corresponding to PCT Application No. PCT/US2012/065967 filed Nov. 20, 2012 (14 pages).

Gobbetti et al., "Technical Strategies for Massive Model Visualization", Proceedings of the 2008 ACM symposium on Solid and Physical Modeling New York 2008, 11pages.

* cited by examiner

| | |
|---|---|
| 4 | t1 |
| 1 | t2 |
| 1 | t3 |
| 1 | t4 |
| 10 | t1:t8 |
| 11 | t1:t9 |
| 14 | t1:t10 |
| 14 | t1:t11 |
| 16 | t1:t12 |
| 2 | t2:t8 |
| 3 | t2:t9 |
| 6 | t2:t10 |
| 8 | t2:t11 |
| 8 | t2:t12 |
| 2 | t3:t8 |
| 3 | t3:t9 |
| 6 | t3:t10 |
| 8 | t3:t11 |
| 8 | t3:t12 |
| 2 | t4:t8 |
| 3 | t4:t9 |
| 6 | t4:t10 |
| 8 | t4:t11 |
| 8 | t4:t12 |
| 6 | t5:t13 |
| 19 | t5:t14 |
| 3 | t5:t15 |
| 12 | t5:t16 |
| 18 | t5:t17 |
| 18 | t6:t13 |
| 8 | t6:t14 |
| 8 | t6:t15 |
| 7 | t6:t16 |
| 2 | t6:t17 |
| 18 | t7:t13 |
| 8 | t7:t14 |
| 8 | t7:t15 |
| 7 | t7:t16 |
| 2 | t7:t17 |

FIG. 3A

| | |
|---|---|
| 4 | t1 |
| 1 | t2 |
| 1 | t3 |
| 1 | t4 |
| 10 | t1:t8 |
| 11 | t1:t9 |
| 14 | t1:t10 |
| 14 | t1:t11 |
| 16 | t1:t12 |
| 2 | t2:t8 |
| 8 | t2:t9 |
| 6 | t2:t10 |
| 8 | t2:t11 |
| 8 | t2:t12 |
| 2 | t3:t8 |
| 8 | t3:t9 |
| 6 | t3:t10 |
| 8 | t3:t11 |
| 8 | t3:t12 |
| 2 | t4:t8 |
| 8 | t4:t9 |
| 6 | t4:t10 |
| 8 | t4:t11 |
| 8 | t4:t12 |
| 6 | t5:t13 |
| 19 | t5:t14 |
| 3 | t5:t15 |
| 12 | t5:t16 |
| 18 | t5:t17 |
| 18 | t6:t13 |
| 8 | t6:t14 |
| 8 | t6:t15 |
| 7 | t6:t16 |
| 2 | t6:t17 |
| 18 | t7:t13 |
| 8 | t7:t14 |
| 8 | t7:t15 |
| 7 | t7:t16 |
| 2 | t7:t17 |

FIG. 3B

| | |
|---|---|
| 4 | t1 |
| 1 | t2 |
| 1 | t3 |
| 1 | t4 |
| 10 | t1:t8 |
| 11 | t1:t9 |
| 14 | t1:t10 |
| 14 | t1:t11 |
| 16 | t1:t12 |
| 2 | t2:t8 |
| 8 | t2:t9 |
| 6 | t2:t10 |
| 8 | t2:t11 |
| 8 | t2:t12 |
| 2 | t3:t8 |
| 8 | t3:t9 |
| 6 | t3:t10 |
| 8 | t3:t11 |
| 8 | t3:t12 |
| 2 | t4:t8 |
| 8 | t4:t9 |
| 6 | t4:t10 |
| 8 | t4:t11 |
| 8 | t4:t12 |
| 6 | t5:t13 |
| 19 | t5:t14 |
| 3 | t5:t15 |
| 12 | t5:t16 |
| 18 | t5:t17 |
| 18 | t6:t13 |
| 8 | t6:t14 |
| 8 | t6:t15 |
| 7 | t6:t16 |
| 2 | t6:t17 |
| 18 | t7:t13 |
| 8 | t7:t14 |
| 8 | t7:t15 |
| 7 | t7:t16 |
| 2 | t7:t17 |

FIG. 5

MASSIVE MODEL VISUALIZATION WITH SPATIAL INDEXING

CROSS-REFERENCE TO RELATED APPLICATION

This application claims priority to and the benefit of the filing date of India Patent Application 1486/KOL/2011, filed Nov. 23, 2011, which is hereby incorporated by reference. This application also includes some subject matter in common with concurrently-filed applications 13/606,590 for "Massive Model Visualization in PDM Systems" and 13/606,574 for "Massive Model Visualization with Spatial Retrieval", which are hereby incorporated by reference.

TECHNICAL FIELD

The present disclosure is directed, in general, to computer-aided design, visualization, and manufacturing systems, product lifecycle management ("PLM") systems, and similar systems, that manage data for products and other items (collectively, "Product Data Management" systems or PDM systems).

BACKGROUND OF THE DISCLOSURE

PDM systems manage PLM and other data. Improved systems are desirable.

SUMMARY OF THE DISCLOSURE

Various disclosed embodiments include systems and methods for improved PDM processes. A method includes storing a hierarchical product data structure that includes a plurality of occurrence nodes and component nodes. The component nodes include a cell index value for a corresponding product component that identifies the product component's spatial location according to defined cells of a three-dimensional model of the product assembly. The method includes creating an occurrence equivalency table from, the hierarchical product data structure, that identifies at least one anchor occurrence node, and at least one equivalent occurrence node that connects a same parent component node and a same child component node as the anchor occurrence node. The product component corresponding to the equivalent occurrence node is spatially located within a specified distance threshold of product component corresponding to the anchor occurrence node. The method includes creating an anchor occurrence table corresponding to the hierarchical product data structure that lists a plurality of unique occurrence chain represented by the hierarchical product data structure, where each equivalent occurrence node is replaced by its corresponding anchor occurrence node, and that associates each listed unique occurrence chain with an associated cell index value.

The foregoing has outlined rather broadly the features and technical advantages of the present disclosure so that those skilled in the art may better understand the detailed description that follows. Additional features and advantages of the disclosure will be described hereinafter that form the subject of the claims. Those skilled in the art will appreciate that they may readily use the conception and the specific embodiment disclosed as a basis for modifying or designing other structures for carrying out the same purposes of the present disclosure. Those skilled in the art will also realize that such equivalent constructions do not depart from the spirit and scope of the disclosure in its broadest form.

Before undertaking the DETAILED DESCRIPTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases. While some terms may include a wide variety of embodiments, the appended claims may expressly limit these terms to specific embodiments.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

FIGS. 1 through 5, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged device. The numerous innovative teachings of the present application will be described with reference to exemplary non-limiting embodiments.

Massive Model Visualization (MMV) systems are able to render models with millions of parts by identifying the (typically small) subset of part occurrences that is actually needed to produce a correct image. Visibility-guided rendering (VGR) algorithms traverse a pre-computed spatial structure in order to determine which occurrences are potentially visible from a given eye point in an efficient manner.

It is a valuable and typical practice to model products, factories, and other complex entities composed of many constituents into a hierarchical structure of reusable elements. Examples of reusable elements include parts and assemblies, logical systems, fasteners, welds, and factory cells. A single element can be instantiated many different times in a structure. Each instantiation represents a different usage of the same identically defined element and is referred to as an "occurrence" of that element. For example, a car may have four identical wheels. There is a single definition of the wheel, but it is instantiated four times in the product structure of that car. There are, therefore, four wheel occurrences in the car corresponding to the front left, front right, rear left, and rear right wheels; each of these occurrences can also have geometric or spatial information indicating the location of the element in the vehicle.

The ability to model each occurrence explicitly and associate unique data to it while retaining the cohesiveness of the common definition element has been one of the key innovations in product structure management in recent years. The powerful features supported by an occurrence based model include the ability to define and scope specific information about the usage of an element to the exact context it applies and to work within nested contexts that override data from lower level to higher level contexts. An occurrence, as used herein, represents a path through such a product data model of an assembly to a specific node in its proper context, including all parent nodes.

Figure 1:
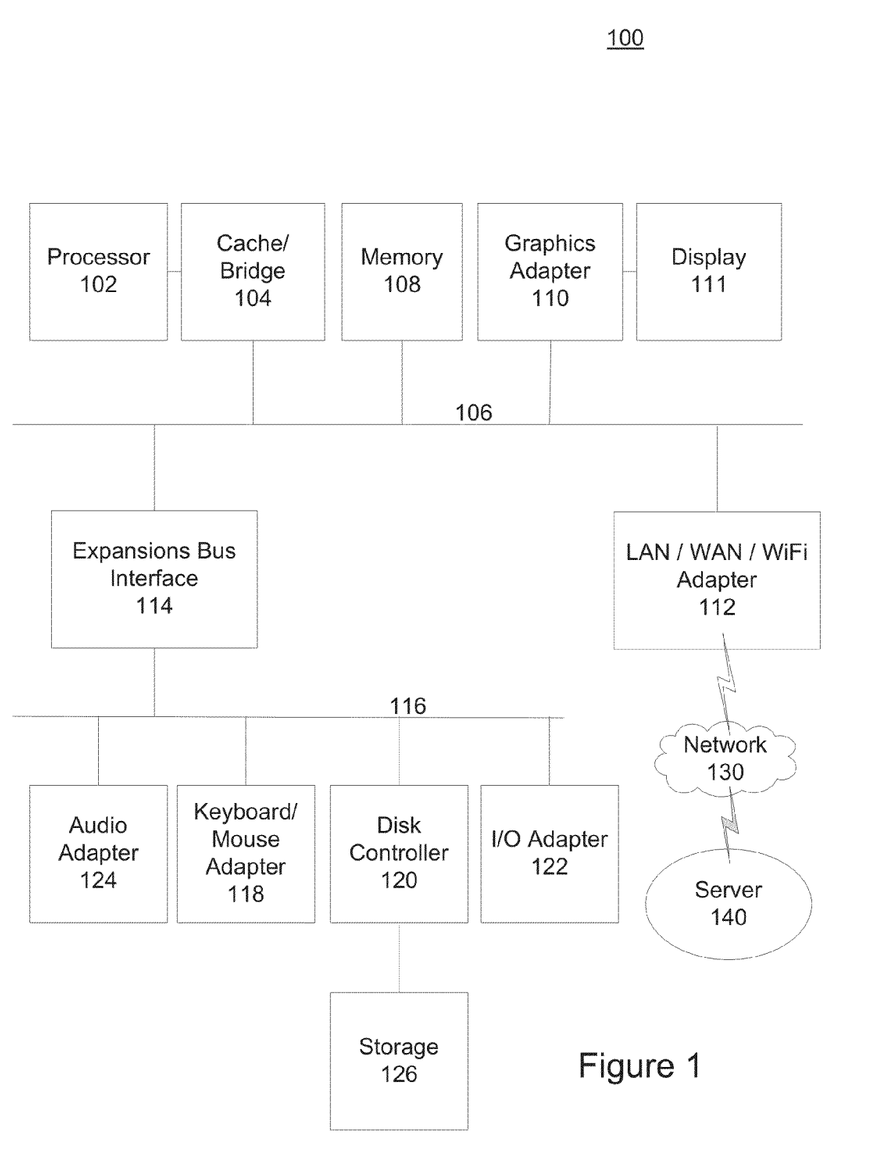
FIG. 1 depicts a block diagram of a data processing system in which an embodiment can be implemented.

FIG. 1 depicts a block diagram of a data processing system in which an embodiment can be implemented, for example as a PDM system particularly configured by software or otherwise to perform the processes as described herein, and in particular as each one of a plurality of interconnected and communicating systems as described herein. The data processing system depicted includes a processor 102 connected to a level two cache/bridge 104, which is connected in turn to a local system bus 106. Local system bus 106 may be, for example, a peripheral component interconnect (PCI) architecture bus. Also connected to local system bus in the depicted example are a main memory 108 and a graphics adapter 110. The graphics adapter 110 may be connected to display 111.

Other peripherals, such as local area network (LAN)/Wide Area Network/Wireless (e.g. WiFi) adapter 112, may also be connected to local system bus 106. Expansion bus interface 114 connects local system bus 106 to input/output (I/O) bus 116. I/O bus 116 is connected to keyboard/mouse adapter 118, disk controller 120, and I/O adapter 122. Disk controller 120 can be connected to a storage 126, which can be any suitable machine usable or machine readable storage medium, including but not limited to nonvolatile, hard-coded type mediums such as read only memories (ROMs) or erasable, electrically programmable read only memories (EEPROMs), magnetic tape storage, and user-recordable type mediums such as floppy disks, hard disk drives and compact disk read only memories (CD-ROMs) or digital versatile disks (DVDs), and other known optical, electrical, or magnetic storage devices.

Also connected to I/O bus 116 in the example shown is audio adapter 124, to which speakers (not shown) may be connected for playing sounds. Keyboard/mouse adapter 118 provides a connection for a pointing device (not shown), such as a mouse, trackball, trackpointer, etc.

Those of ordinary skill in the art will appreciate that the hardware depicted in FIG. 1 may vary for particular implementations. For example, other peripheral devices, such as an optical disk drive and the like, also may be used in addition or in place of the hardware depicted. The depicted example is provided for the purpose of explanation only and is not meant to imply architectural limitations with respect to the present disclosure.

A data processing system in accordance with an embodiment of the present disclosure includes an operating system employing a graphical user interface. The operating system permits multiple display windows to be presented in the graphical user interface simultaneously, with each display window providing an interface to a different application or to a different instance of the same application. A cursor in the graphical user interface may be manipulated by a user through the pointing device. The position of the cursor may be changed and/or an event, such as clicking a mouse button, generated to actuate a desired response.

One of various commercial operating systems, such as a version of Microsoft Windows™, a product of Microsoft Corporation located in Redmond, Wash. may be employed if suitably modified. The operating system is modified or created in accordance with the present disclosure as described.

LAN/WAN/Wireless adapter 112 can be connected to a network 130 (not a part of data processing system 100), which can be any public or private data processing system network or combination of networks, as known to those of skill in the art, including the Internet. Data processing system 100 can communicate over network 130 with server system 140, which is also not part of data processing system 100, but can be implemented, for example, as a separate data processing system 100.

Disclosed embodiments include a PDM system, method, and apparatus for spatial and structural indexing on configurable hierarchical BOM structure. In PDM, a product program is persisted in the database as a collection of BOM lines, organized hierarchically to reflect the logical design relation between different product components. The persisted product data can form the superset of the design information about each product in the program including all design variants and the entire design history. To be able to represent the product from an alternative spatial perspective and properly correlate the spatial representation with the structural representation is critical for MMV display.

Various embodiments include an indexing structure that correlates the spatial description of the persisted product data with the structure description of the same data, for the purpose of quickly identifying one representation given the other representation.

One important scalability aspect of some embodiments is that occurrence nodes that are structurally equivalent and geometrically similar are grouped together to achieve more compact representation.

In PDM, a product program can be persisted in the database as a collection of BOM lines, organized hierarchically to reflect the logical design relation between different product components. The persisted product data forms the superset of the design information about each product in the program including all design variants and the entire design history.

Figure 2:
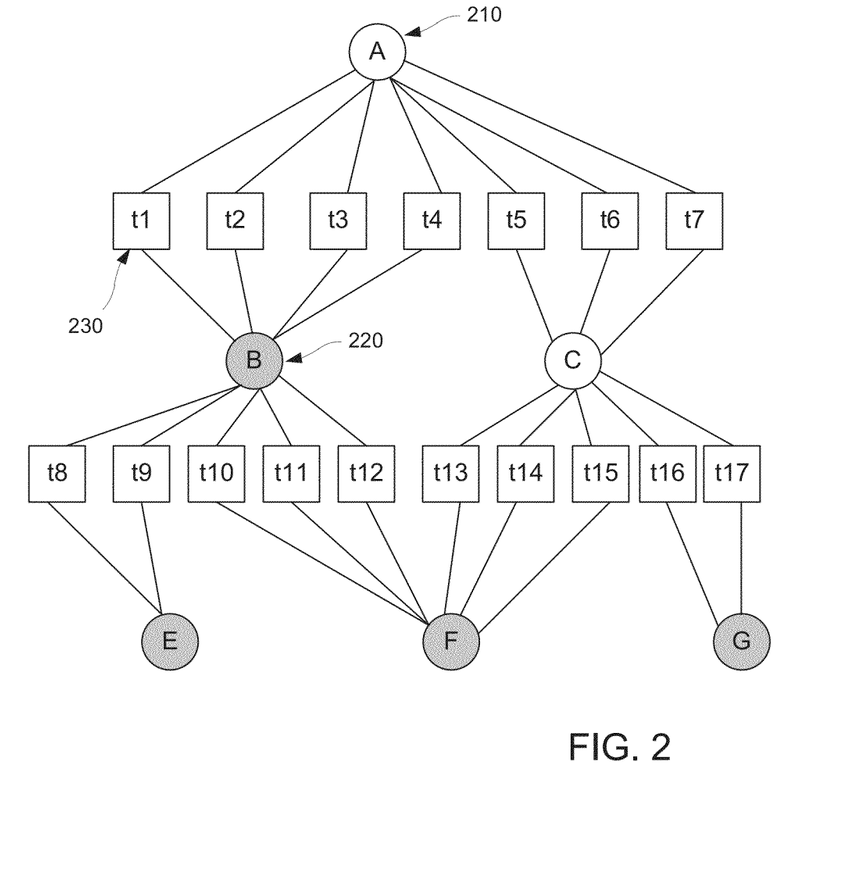
FIG. 2 shows a conceptual illustration of the persisted hierarchical data of an example product.

FIG. 2 shows a conceptual illustration of the persisted hierarchical data of an example product. In this example, unshaded circles, such as node A 210, represent component nodes with no geometry. Shaded circles, such as node B 220, represent components nodes with geometry. Squares, such as occurrence t1 230, represent occurrence nodes. Each non-leaf component node may have one or more occurrence nodes as its children, where each occurrence node carries a transform matrix that defines the positioning of the component it points to. Some component nodes contain geometric information as part of its definition. The collection of all component geometry, when properly transformed placed into a desired coordinate system, forms the geometric definition of the product and determines what the product looks like when it is visualized. Each component node with geometry definition can be described either from spatial perspective, i.e., where it is relative to the entire product geometry, or from structural perspective, i.e., how to traverse the hierarchical structure from the product root node to the component node. The spatial perspective refers to the representation of the component's physical positioning with respect to the other components and the assembly as a whole.

The spatial description of each geometric component can be concisely defined by an integer index based on any chosen type of spatial partitioning of the product bounding box into a set of hierarchical cells, while the structural description can be derived from the hierarchical structure definition. In various embodiments, a spatial index table is used from the hierarchical structure to keep track of the spatial description for each distinct instance of every geometric component. That is, the product or assembly can be subdivided into three-dimensional "cells" or regions that are each assigned an index value; one or more of those index value can then be associated with each component to describe its geometric or spatial location according to the defined cells, and such index values can therefore be used to identify the relative locations of different components. A single spatial index value may be associated with multiple components or occurrences, which would indicate that they share the same 3D cell (in whole or in part).

Figure 3A:
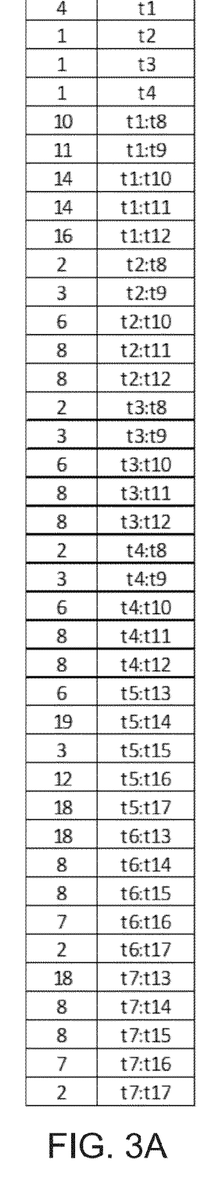
FIGS. 3A-3C illustrate an example of a spatial index table and its use, in accordance with disclosed embodiments.
Figure 3B:
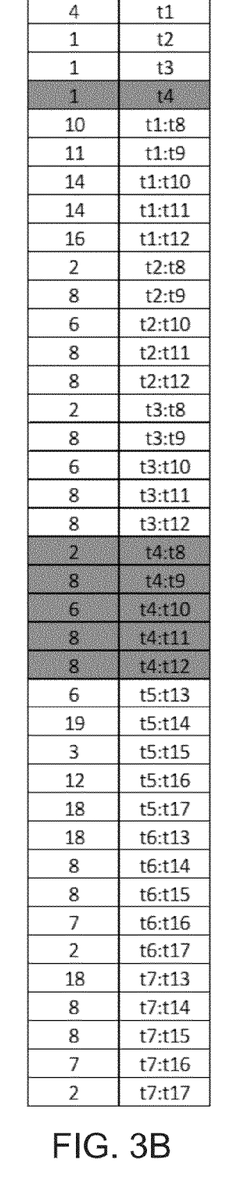
Figure 3C:
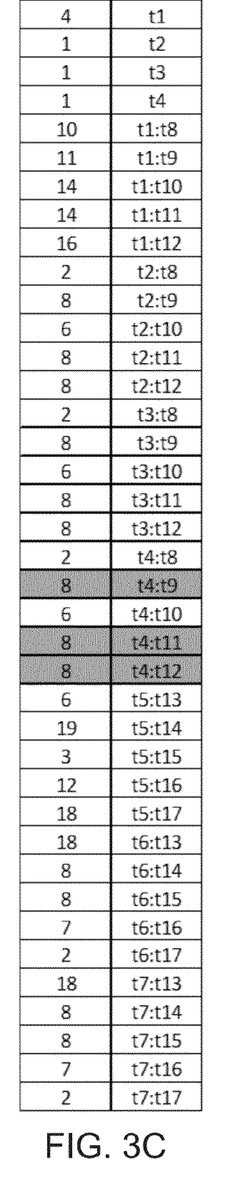

FIGS. 3A-3C illustrate an example of a spatial index table and its use, corresponding to the structure shown in FIG. 2. In this example, the first column represents the cell index assigned based on its geometric size and position and the second column represents a chain of occurrence nodes separated by colon. FIG. 3A shows an example of the spatial index table.

FIG. 3B illustrates an example of retrieving all the components based on structural criterion, i.e. all components belonging to occurrence t4. This can be performed by the system by a single database query against the second column. In FIG. 3B, the shaded cells illustrates the cells that have occurrence t4 in the occurrence chain reflected in the second column, and the corresponding cell index is shown in the first column. A query of the spatial index table for occurrence t4 would return occurrence chains t4, t4:t8, t4:t9, t4:t10, t4:t11, and t4:t12.

FIG. 3C illustrates how the query can be refined by an additional spatial criterion such that all instances that both belong to assembly t4 and are located in cell 8 are identified. Such a query would return occurrence chains t4:t9, t4:t11, and t4:t12.

Enumerating all distinct geometric component instances can cause practical issues when the product has a rich history of design data. Often, a parent component can frequently contain hundreds of occurrences that point to the same child component due to the accumulation of the design data across different design revisions over a long period of time. In such case, the number of distinct components in the product can be very large due to combinatorial explosion across multiple hierarchical levels where the number of hierarchical levels frequently exceeds twenty for practical design data. One critical observation is that many of the distinct components occupy exactly the same spatial location in the world coordinate system. This can happen because the persisted product data is aggregation of all the design revisions across all the design variants. Between different revisions, the design of most components remains unchanged and therefore is duplicated in each revision.

Disclosed embodiments use an "equivalent occurrence group" to achieve more compact indexing representation. Two occurrences are considered "equivalent" if they connect the same parent component and the same child component and that if their transform matrices, representing their spatial locations, are considered sufficiently close to each other as measured by a distance threshold δ. If the distance threshold δ is set to be zero, then the transform matrices are required to be identical for two occurrences to be equivalent to each other. All occurrences that are equivalent to each other form an equivalent occurrence group.

Within each equivalent occurrence group, one occurrence is chosen or designated to be an "anchor occurrence" and all the other occurrences are called "equivalent occurrences". An occurrence chain is a chain of occurrences linked in the hierarchical data structure; an occurrence chain that consists of only anchor occurrences is called an "anchor occurrence chain".

Disclosed embodiments include a much more compact representation that represents occurrence chains by using anchor occurrences and anchor occurrence chains.

Disclosed embodiments can also represent all occurrence equivalence relations in a second table. The cell index of an anchor occurrence chain is decided by the combined bounding box of all the equivalent occurrence chains in the world coordinate system. That is, a bounding box is determined that corresponds to the geometric bounds of all the equivalent occurrence chains, and the corresponding cell index (or indices) for the bounding box is used for the anchor occurrence chain. In the special case when distance threshold δ is set to be zero, only the bounding box of the anchor occurrence chain needs be considered since the bounding boxes of all its equivalent occurrence chains are identical.

The combined bounding box, for a set of bounding boxes, is the minimal bounding box that encloses all the bounding boxes in the set. The identification or calculation of the combined bounding box from a set of bounding boxes is known to those of skill in the art.

Figure 4:
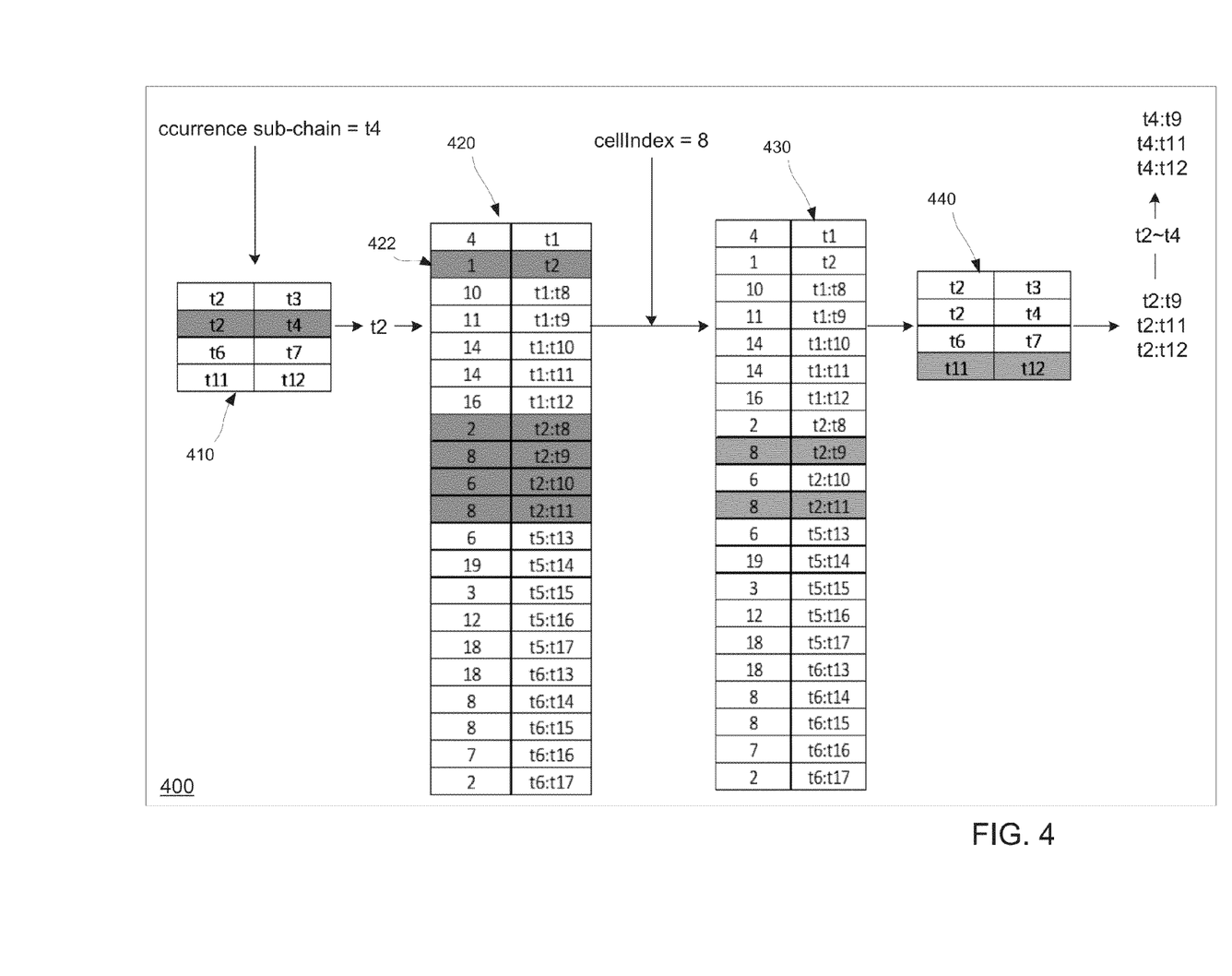
FIG. 4 illustrates various data structures stored in and maintained by a PDM data processing system, in accordance with disclosed embodiments.

FIG. 4 illustrates various data structures stored in and maintained by a PDM data processing system 400, operating on data as shown if in FIGS. 2 and 3A-3C. In this example, assuming that there are three equivalent occurrence groups in the example structure shown in FIG. 2: {t2, t3, t4}, {t6, t7} and {t11, t12}.

FIG. 4 illustrates an occurrence equivalency table 410 showing equivalency between the anchor occurrences in the left column and the equivalent occurrences, corresponding to each of the anchor occurrences, in the right column. In occurrence equivalency table 410, it is assumed that t2, t6, and t11 are chosen to be anchor occurrences in their respective groups, so t2 is shown as the anchor occurrence to its equivalents t3 and t4, t6 is shown as the anchor occurrence to equivalent t7, and t11 is shown as the anchor occurrence to equivalent t12.

FIG. 4 also illustrates an anchor occurrence table 420, corresponding to the spatial index table of FIG. 3A. Anchor occurrence table 420 is much more compact than the original spatial index table, since, for example, the row at 422 indicates that cell index 1 corresponds to anchor occurrence t2, without also requiring additional rows to specify that cell index 1 also corresponds to equivalent occurrences t3 and t4.

Also shown in FIG. 4 is how the same queries shown in FIG. 3 would be done with an occurrence equivalency table. Each occurrence node in the occurrence chain must be queried in the occurrence equivalency table first to identify the corresponding anchor occurrence before the formulated anchor occurrence chain is queried in the occurrence table.

FIG. 4 also illustrates an example of retrieving all the components based on structural criterion, i.e. all components belonging to occurrence sub-chain t4. In this case, the system must first query the occurrence equivalency table 410 to determine that t4 is listed as an equivalent with t2 as its anchor occurrence. Anchor occurrence table 420 is then queried using anchor occurrence t2. In anchor occurrence table 420, the shaded cells illustrate the cells that have occurrence t2 in the occurrence chain reflected in the second column, and the corresponding cell index is shown in the first column. A query of the anchor occurrence table 420 for occurrence t2—the anchor occurrence of equivalent occurrence t4—would return occurrence chains t2, t2:t8, t2:t9, t2:t10, and t2:t11. In returning the results, the system can also again expand any equivalents and convert the results back to reference the original queried occurrence. That is, from the set of result above, the system can convert the t2 references back to t4, and add the occurrence chain t2:12, since it is the equivalent of the t2:11 occurrence chain. The returned results can therefore be t4, t4:t8, t4:t9, t4:t10, t4:t11, and t4:t12, the same results as in the example of FIG. 3B.

FIG. 4 illustrates how the query can be refined by an additional spatial criterion such that all instances that both belong to assembly t4 and are located in cell 8 are identified. The initial lookup to the occurrence equivalency table 410 is as described above, and the query to the anchor occurrence table 430 also specifies that the cell index is 8. Such a query would return occurrence chains t2:t9, and t2:t11. As above, the t2 can be converted back to t4, and another lookup to the occurrence equivalency table 410 indicates that t12 is an equivalent of t11, as shown in another instance of the occurrence equivalency table at 440. The final returned result can be t4:t9, t4:t11, and t4:t12.

Disclosed embodiments can also be used in implementations other than the specific MMV use case. For example, it can be used to quickly answer questions like "what components are located within this bounding volume?" or "what is the bounding box of one or more components (leaf or non-leaf)?". Disclosed embodiments provide a "bridge" between spatial and structural information, regardless exactly how this "bridge" is used.

One significant technical advantage of disclosed embodiments is the decrease in required storage and processing using tables as described above. For example, the occurrence equivalency table and anchor occurrence table, in combination, can require significantly less storage space on the PDM system than a corresponding spatial index table that includes separate entries for each equivalent occurrence chain, particularly for large, multi-level BOM structures with many variants.

Figure 5:
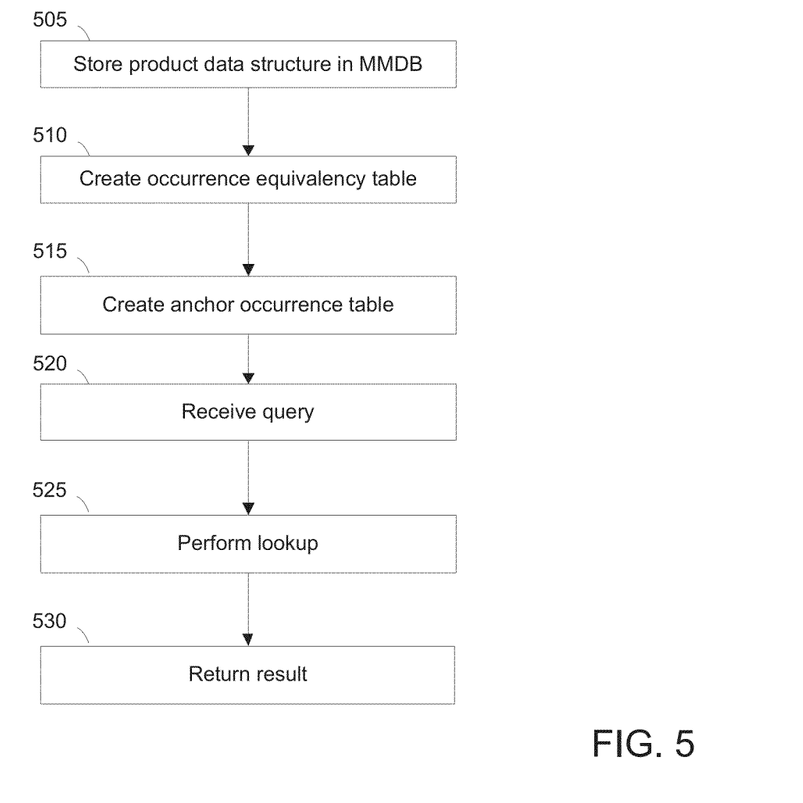
FIG. 5 depicts a flowchart of a process in accordance with disclosed embodiments.

FIG. 5 depicts a flowchart of a process in accordance with disclosed embodiments, that can be implemented by one or more PDM systems as described herein, referred to in the singular as the "system."

The system stores a hierarchical product data structure (step 505), such as in a massive model database. The product data structure preferably represents a product assembly, and can include interconnected nodes representing product components with no included geometric information, nodes representing product components with geometric information, and occurrence nodes. The geometric information can include a cell index value for the corresponding component that identifies the component's spatial location according to defined cells of a three-dimensional model of the product assembly. This step can include receiving the hierarchical product data structure from another device or process for storage. The hierarchical data structure can be, in some cases, a product BOM structure.

The system creates an occurrence equivalency table (step 510). The occurrence equivalency table identifies at least one anchor occurrence node, and identifies at least one equivalent occurrence node that connects a same parent component node and a same child component node as the anchor occurrence node, and that is spatially located within a specified distance threshold of the anchor occurrence node.

That is, the product component corresponding to the equivalent occurrence node is spatially located within a specified distance threshold of product component corresponding to the anchor occurrence node. The equivalent occurrence node can be considered spatially located within a specified distance threshold of the anchor occurrence node if its transform matrix is within the threshold distance of the transform matrix of the anchor occurrence node. The system can store the occurrence equivalency table.

The system creates an anchor occurrence table corresponding to the hierarchical product data structure (step 515). This step can include identifying each unique occurrence chain in the hierarchical product data structure, where each equivalent occurrence node is replaced by its corresponding anchor occurrence node. The anchor occurrence table associates each identified unique occurrence chain with an associated cell index value. The system can store the anchor occurrence table.

The structure of the anchor occurrence table lists a plurality of unique occurrence chains represented by the hierarchical product data structure, where each equivalent occurrence node is replaced by its corresponding anchor occurrence node, and associates each listed unique occurrence chain with an associated cell index value.

The system can receive a query (step 520). The query can reference an occurrence node, and can reference a cell index value.

The system can perform a lookup process on the occurrence equivalency table and anchor occurrence table according to the query (step 525). This can include replacing the referenced occurrence node with a corresponding anchor occurrence node as described above.

The system can return a query result corresponding to the query that identifies occurrence chains corresponding to the query (step 530). This step can include storing, displaying, or transmitting the query result.

Of course, those of skill in the art will recognize that, unless specifically indicated or required by the sequence of operations, certain steps in the processes described above may be omitted, performed concurrently or sequentially, or performed in a different order.

Those skilled in the art will recognize that, for simplicity and clarity, the full structure and operation of all data processing systems suitable for use with the present disclosure is not being depicted or described herein. Instead, only so much of a data processing system as is unique to the present disclosure or necessary for an understanding of the present disclosure is depicted and described. The remainder of the construction and operation of data processing system 100 may conform to any of the various current implementations and practices known in the art.

It is important to note that while the disclosure includes a description in the context of a fully functional system, those skilled in the art will appreciate that at least portions of the mechanism of the present disclosure are capable of being distributed in the form of instructions contained within a machine-usable, computer-usable, or computer-readable medium in any of a variety of forms, and that the present disclosure applies equally regardless of the particular type of instruction or signal bearing medium or storage medium utilized to actually carry out the distribution. Examples of machine usable/readable or computer usable/readable mediums include: nonvolatile, hard-coded type mediums such as read only memories (ROMs) or erasable, electrically programmable read only memories (EEPROMs), and user-recordable type mediums such as floppy disks, hard disk drives and compact disk read only memories (CD-ROMs) or digital versatile disks (DVDs).

Although an exemplary embodiment of the present disclosure has been described in detail, those skilled in the art will understand that various changes, substitutions, variations, and improvements disclosed herein may be made without departing from the spirit and scope of the disclosure in its broadest form.

None of the description in the present application should be read as implying that any particular element, step, or function is an essential element which must be included in the claim scope: the scope of patented subject matter is defined only by the allowed claims. Moreover, none of these claims are intended to invoke paragraph six of 35 USC §112 unless the exact words "means for" are followed by a participle.

What is claimed is:

1. A method for massive-model visualization, comprising:
    storing a hierarchical product data structure for a product assembly using a product data management (PDM) system,
        wherein the hierarchical product data structure includes a plurality of occurrence nodes and component nodes, and
        wherein the component nodes include a cell index value for a corresponding product component that identifies the corresponding product component's spatial location according to defined cells of a three-dimensional model of the product assembly;
    identifying, in the hierarchical produce data structure, at least one anchor occurrence node and identifying at least one equivalent occurrence node that connects a same parent component node and a same child component node as the anchor occurrence node;
    using the PDM system to create an occurrence equivalency table from the hierarchical product data structure according to the identified anchor occurrence node and equivalent occurrence node,
        wherein a product component corresponding to the equivalent occurrence node is spatially located within a specified distance threshold of a product component corresponding to the anchor occurrence node;
    using the PDM system to create an anchor occurrence table corresponding to the hierarchical product data structure,
        wherein the anchor occurrence table lists a plurality of unique occurrence chains represented by the hierarchical product data structure, where each equivalent occurrence node is replaced by its corresponding anchor occurrence node, and the anchor occurrence table associates each listed unique occurrence chain with an associated cell index value; and
    storing the occurrence equivalency table and anchor occurrence table in the PDM system.

2. The method of claim 1, wherein, subsequent to the storing of the occurrence equivalency table and anchor occurrence table in the PDM system, the PDM system receives a query that references an occurrence node, the PDM system performs a lookup process on the occurrence equivalency table and anchor occurrence table, and the PDM system returns a query result that identifies occurrence chains corresponding to the query.

3. The method of claim 2, wherein the query also references a cell index value.

4. The method of claim 2, wherein performing the lookup process includes replacing the referenced occurrence node with a corresponding anchor occurrence node.

5. The method of claim 1, wherein the PDM system determines whether the product component corresponding to the equivalent occurrence node being spatially located within a specified distance threshold of product component corresponding to the anchor occurrence node by determining whether transform matrices of the nodes are within the threshold distance of each other.

6. The method of claim 1, wherein the hierarchical data structure is a product bill-of-materials (BOM) structure.

7. The method of claim 1, wherein the occurrence equivalency table and anchor occurrence table, in combination, require less storage space on the PDM system than a corresponding spatial index table that includes separate entries for each equivalent occurrence chain.

8. A product data management (PDM) system comprising:
    at least one processor; and
    an accessible memory, the PDM system configured to:
    store a hierarchical product data structure for a product assembly,
        wherein the hierarchical product data structure has a plurality of occurrence nodes and component nodes, and
        wherein the component nodes include a cell index value for a corresponding product component that identifies the corresponding product component's spatial location according to defined cells of a three-dimensional model of the product assembly;
    identify, in the hierarchical produce data structure, at least one anchor occurrence node and identify at least one equivalent occurrence node that connects a same parent component node and a same child component node as the anchor occurrence node;
    create an occurrence equivalency table from the hierarchical product data structure according to the identified anchor occurrence node and equivalent occurrence node,
        wherein a product component corresponding to the equivalent occurrence node is spatially located within a specified distance threshold of a product component corresponding to the anchor occurrence node;
    create an anchor occurrence table corresponding to the hierarchical product data structure,
        wherein the anchor occurrence table lists a plurality of unique occurrence chains represented by the hierarchical product data structure, where each equivalent occurrence node is replaced by its corresponding anchor occurrence node, and the anchor occurrence table associates each listed unique occurrence chain with an associated cell index value; and
    store the occurrence equivalency table and anchor occurrence table.

9. The PDM system of claim 8, wherein, subsequent to the storing of the occurrence equivalency table and anchor occurrence table in the PDM system, the PDM system receives a query that references an occurrence node, the PDM system performs a lookup process on the occurrence equivalency table and anchor occurrence table, and the PDM system returns a query result that identifies occurrence chains corresponding to the query.

10. The PDM system of claim 9, wherein the query also references a cell index value.

11. The PDM system of claim 9, wherein performing the lookup process includes replacing the referenced occurrence node with a corresponding anchor occurrence node.

12. The PDM system of claim 8, wherein the PDM system determines whether the product component corresponding to the equivalent occurrence node being spatially located within a specified distance threshold of product component corresponding to the anchor occurrence node by determining whether transform matrices of the nodes are within the threshold distance of each other.

13. The PDM system of claim 8, wherein the hierarchical data structure is a product bill-of-materials (BOM) structure.

14. The PDM system of claim 8, wherein the occurrence equivalency table and anchor occurrence table, in combination, require less storage space on the PDM system than a corresponding spatial index table that includes separate entries for each equivalent occurrence chain.

15. A non-transitory computer-readable medium encoded with computer-executable instructions that, when executed, cause a product data management (PDM) system to:
store a hierarchical product data structure for a product assembly,
wherein the hierarchical product data structure has a plurality of occurrence nodes and component nodes, and
wherein the component nodes include a cell index value for a corresponding product component that identifies the corresponding product component's spatial location according to defined cells of a three-dimensional model of the product assembly;
identify, in the hierarchical produce data structure, at least one anchor occurrence node and identify at least one equivalent occurrence node that connects a same parent component node and a same child component node as the anchor occurrence node;
create an occurrence equivalency table from the hierarchical product data structure according to the identified anchor occurrence node and equivalent occurrence node,
wherein a product component corresponding to the equivalent occurrence node is spatially located within a specified distance threshold of a product component corresponding to the anchor occurrence node;
create an anchor occurrence table corresponding to the hierarchical product data structure,
wherein the anchor occurrence table lists a plurality of unique occurrence chains represented by the hierarchical product data structure, where each equivalent occurrence node is replaced by its corresponding anchor occurrence node, and the anchor occurrence table associates each listed unique occurrence chain with an associated cell index value; and
store the occurrence equivalency table and anchor occurrence table.

16. The computer-readable medium of claim 15, wherein, subsequent to the storing of the occurrence equivalency table and anchor occurrence table in the PDM system, the PDM system receives a query that references an occurrence node, the PDM system performs a lookup process on the occurrence equivalency table and anchor occurrence table, and the PDM system returns a query result that identifies occurrence chains corresponding to the query.

17. The computer-readable medium of claim 16, wherein the query also references a cell index value.

18. The computer-readable medium of claim 16, wherein performing the lookup process includes replacing the referenced occurrence node with a corresponding anchor occurrence node.

19. The computer-readable medium of claim 15, wherein the PDM system determines whether the product component corresponding to the equivalent occurrence node being spatially located within a specified distance threshold of product component corresponding to the anchor occurrence node by determining whether transform matrices of the nodes are within the threshold distance of each other.

20. The computer-readable medium of claim 15, wherein the hierarchical data structure is a product bill-of-materials (BOM) structure.

21. The computer-readable medium of claim 15, wherein the occurrence equivalency table and anchor occurrence table, in combination, require less storage space on the PDM system than a corresponding spatial index table that includes separate entries for each equivalent occurrence chain.

* * * * *